United States Patent [19]

Bassous et al.

[11] Patent Number: 5,501,787
[45] Date of Patent: Mar. 26, 1996

[54] IMMERSION SCANNING SYSTEM FOR FABRICATING POROUS SILICON FILMS

[75] Inventors: Ernest Bassous, Bronx; Jean-Marc Halbout, Larchmont; Subramanian S. Iyer, Yorktown Heights, all of N.Y.; Vijay P. Kesan, Ridgefield, Conn.

[73] Assignee: International Business Machines Corporation, Armonk, N.Y.

[21] Appl. No.: 395,936

[22] Filed: Feb. 27, 1995

Related U.S. Application Data

[62] Division of Ser. No. 266,444, Jun. 27, 1994, Pat. No. 5,458,756, which is a continuation of Ser. No. 862,939, Apr. 3, 1992, abandoned.

[51] Int. Cl.$^6$ ............................. C25D 7/12; C25D 11/32
[52] U.S. Cl. ..................... 205/124; 205/137; 205/148; 205/157; 205/651; 205/656; 205/674
[58] Field of Search ..................... 204/129.3, 129.55, 204/129.7, 129.75; 205/123, 137, 148, 157, 124

[56] References Cited

U.S. PATENT DOCUMENTS

| | | | |
|---|---|---|---|
| 3,388,047 | 6/1968 | Higgins | 205/123 X |
| 3,536,600 | 10/1970 | Van Dijk et al. | 204/129.3 |
| 3,841,931 | 10/1974 | MacArthur et al. | 204/129.75 X |
| 3,962,052 | 6/1976 | Abbas et al. | 204/129.3 |
| 4,995,954 | 2/1991 | Guilinger et al. | 204/129.75 |

*Primary Examiner*—Donald R. Valentine
*Attorney, Agent, or Firm*—Thomas P. Dowd; Ronald L. Drumheller

[57] ABSTRACT

A system for making porous silicon on blank and patterned Si substrates by "immersion scanning", particularly suitable for fabricating light-emitting Si devices and utilizing an open electrolytic cell having a cathode and an opposing anode consisting of a Si substrate on which the porous silicon is to be formed, both disposed, with their opposing surfaces in parallel, in an aqueous HF solution electrolyte contained in the cell. The substrate anode is mounted to be movable relative to the electrolyte so as to be mechanically cycled or scanned in and out of the electrolyte at a programmable rate during anodization. The uniformity, thickness and porosity of the resulting anodized layer on the substrate are determined by the scanning speed, number of cycles, current density, and HF-based electrolyte parameters of the system, and the Si substrate resistivity, conductivity type, and crystal orientation. The light-emitting silicon devices produced incorporate porous silicon layers and are operable at room temperature.

14 Claims, 6 Drawing Sheets

IMMERSION SCANNING SYSTEM FOR FABRICATING POROUS SILICON FILMS

This is a division of application Ser. No. 08/266,444 filed Jun. 27, 1994, now U.S. Pat. No. 5,458,756 which was a continuing application based upon application Ser. No. 07/862,939, filed Apr. 3, 1992 now abandoned.

BACKGROUND OF THE INVENTION

1. Field of the Invention

The present invention relates to a method and system for making porous silicon and more particularly for fabricating light-emitting silicon devices incorporating porous silicon.

2. Prior Art

Current electrochemical methods for making uniform photoluminescent porous silicon are not readily applicable to silicon (Si) device fabrication because of their complexity and other limitations. For example, highly porous silicon layers formed by electrochemical etching of Si in hydrofluoric acid-based solutions are very useful in photoluminescent and electroluminescent Si devices. However, such porous silicon layers are currently made in complex systems which are not readily adaptable to incorporation in Si device fabrication processes, in that wafers are mounted with one or both surfaces sealed around the edges inside leak-tight chambers in which hydrofluoric acid (HF) solutions are circulated. Some of the limitations of these systems include:

1. high risk of damaging Si surfaces, particularly those with lithographic patterns;
2. prolonged exposure of Si surfaces to HF;
3. non-uniform anodization of the Si surface due to the peripheral seal;
4. Si surface topography and imperfections can result in HF leaks around the seal;
5. in-situ monitoring during anodization is difficult; and
6. system cost is high and wafer throughput is low.

Examples of such systems are found in the *Materials Research Society* Symposium Proceedings, Light Emmission from Silicon, Boston, Dec. 3–5, 1991.

3. Problem to be Solved

There is therefore a need in the art for a system, having none of these limitations, which is simple to use, low-cost and versatile, and capable of making porous silicon on blank and lithographically or otherwise patterned Si substrates so as to facilitate its use in device fabrication.

SUMMARY OF THE INVENTION

The present invention provides a simple and highly versatile system and method for making porous silicon on blank and patterned Si substrates and is particularly suitable for fabricating light-emitting Si devices. The invention utilizes electrochemical etching in a method referred to as "immersion scanning" involving an electrolytic cell in the form of an open container or vessel with an associated actuating mechanism for moving the substrates, at a constant or variable programmed speed, into and out of the electrolyte to produce porous silicon in a fast, reliable, and selective manner on substrates of any size and geometry.

An immersion scanning system for making porous silicon in accordance with the invention consists essentially of an electrochemical cell having a cathode, of an electrically-conductive and chemically-stable material such as a gold or platinum foil or mesh, and an anode consisting of a substrate composed completely, or at least substantially, of silicon, on which the porous silicon is to be formed. The cell is in the form of a vessel having an open end for accomodating the passage of at least the anode and containing an electrolyte, such as an aqueous hydrofluoric acid (HF) solution, with the anode and cathode disposed with their opposing surfaces in parallel in the electrolyte. The Si substrate may be clamped to a motor-driven arm and mechanically cycled or scanned in and out of the electrolyte through the open end at a programmable rate during anodization. Alternatively, an arrangement more suitable for batch processing (i.e., multiple substrate or wafer processing) may be used wherein the electrolyte is displaced relative to the two electrodes, which are held stationary, with the open end venting the cell interior to permit raising and lowering of the electrolyte level.

The major attributes of the method, particularly for purposes of device fabrication are: (a) exposure of the substrate to the electrolyte may be minimized; (b) uniformity of porous silicon on resist-patterned surfaces is excellent; (c) in-situ monitoring is easy; and (d) any size and shape of substrate can be accommodated by virtue of the open end. The uniformity, thickness and porosity of the anodized layer on a given substrate may be controlled selectively by regulating the scanning speed, number of cycles, current density, and electrolyte composition parameters of the system as well as the Si substrate resistivity, conductivity type, and crystal orientation. The system may be utilized to fabricate light-emitting Si devices that operate at room temperature and incorporate porous silicon layers.

DETAILED DESCRIPTION OF THE PREFERRED EMBODIMENT

In its preferred embodiment, the present invention essentially involves an apparatus, an electrolyte, and an anodization procedure which can be used to produce light-emitting Si devices incorporating porous silicon.

Apparatus

Figure 1:
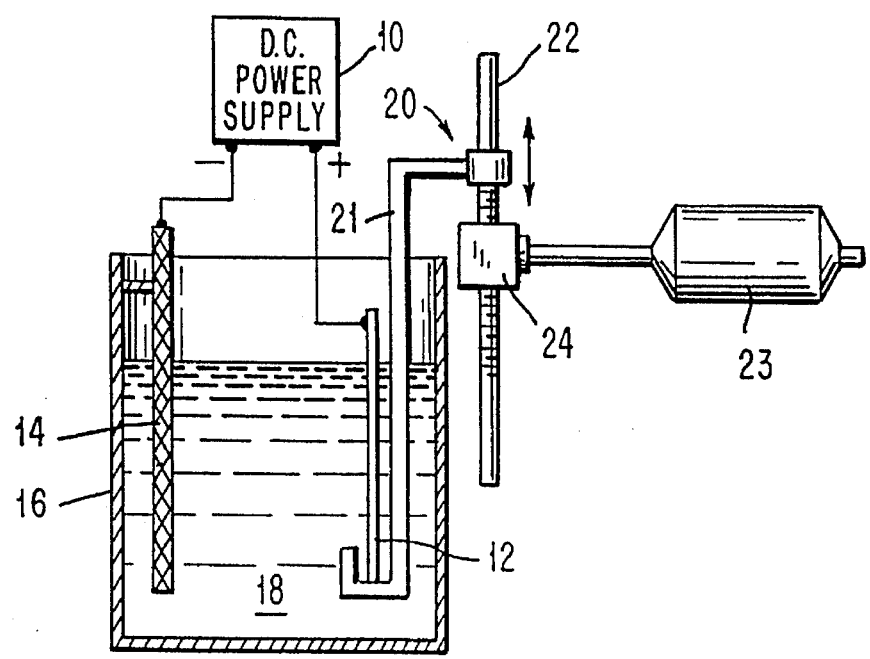
FIG. 1 is a schematic diagram illustrating an immersion scanning apparatus for porous silicon formation in accordance with the present invention.

As shown in FIG. 1, the apparatus embodies an electrochemical etching system consisting of a DC power supply 10 connected to two electrodes, i.e., an anode 12 and a cathode 14. The electrodes are disposed in an electrolyte 18 contained in an unsealed vessel 16 having an open end through which the electrodes extend. A mechanism 20 is provided for moving the anode 12 with respect to the electrolyte 18. In the preferred embodiment, the cathode 14 is made of a suitable metal, e.g., platinum (Pt) foil or mesh, and the anode 12 is the workpiece, i.e., the substrate on which porous silicon is to be formed. The substrate is a silicon wafer and while it also may be in other forms and include some other materials in certain applications, it will be composed of silicon or at least substantially of silicon. The electrolyte is typically an aqueous hydrofluoric acid (HF) solution, preferably of 10–25% HF and with additional components directed to adapting it to the present environment as will be described below. The opposing surfaces of the stationary Pt cathode 14 and the movable Si anode 12 are arranged substantially parallel to each other, approximately 50 mm apart, and are suspended, vertically in this case, in the electrolyte 18. A suitable mechanism for movably suspending the anode 12 is shown to comprise a substrate holder 21 clamped to an arm 22, that is driven by a motor and speed regulator 23 through a suitable drive 24, which mechanically moves or cycles the Si workpiece 12 in and out of the electrolyte 18 through the open end at either a constant or a variable speed. During anodization, a current is produced between the anode 12 and cathode 14, by means of power supply 10, and porous silicon is formed on the portion of the surface of substrate 12 that is immersed in the electrolyte 18. It will be seen that this arrangement is readily adaptable to permit more than one substrate to be mounted on the substrate holder 21 and the multiple substrates to operate as the anode or workpiece for batch processing. The sizes of the vessel and its open end may be variously dimensioned as desired to accomodate the simultaneous passage of a plurality of substrates through the end during immersion.

Figure 2:
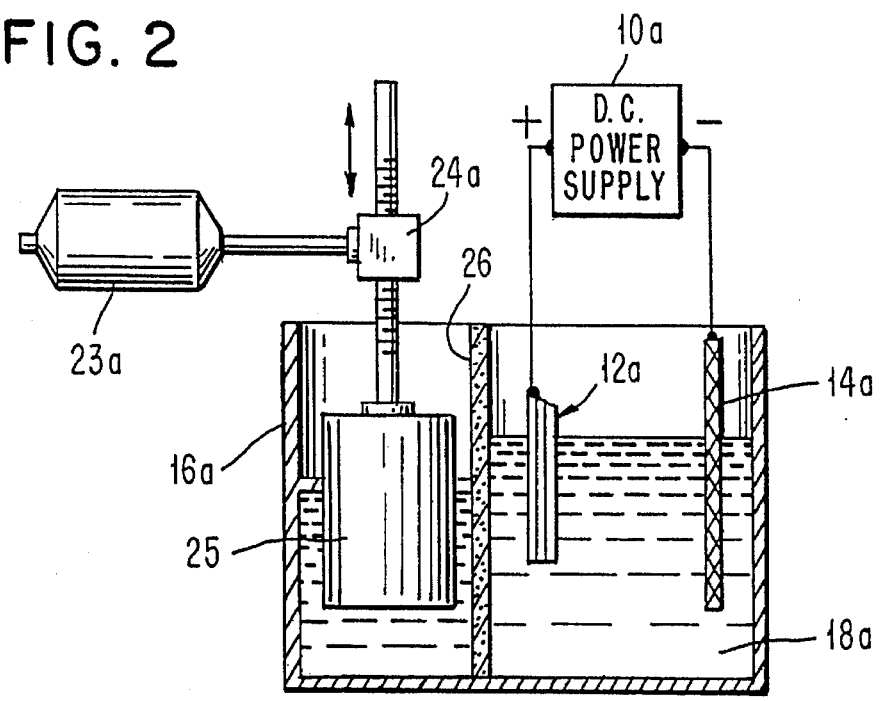
FIG. 2 is a schematic diagram illustrating an alternate apparatus for immersion scanning to fabricate porous silicon using a mechanically driven plunger inside an electrochemical cell that displaces electrolyte across the Si surface to be anodized.

Instead of the suspension arrangement shown in FIG. 1, which cycles the workpiece in and out of the electrolyte, alternative immersion scanning systems could be used that may be found to be more suitable for batch processing by displacing the electrolyte relative to the electrodes which are held stationary. One example is illustrated in FIG. 2, wherein the displacement of the electrolyte can be regulated by a dummy plunger 25 which may be controllably immersed to different levels in the electrolyte 18a by means of a suitable motor 23a and drive 24a. The plunger 25 may be operated in a separate compartment in the electrolyte-containing vessel 16a set apart from the electrode chamber by a porous wall 26 to avoid any interference with the electrodes or undue turbulence in the electrolyte. The anode is composed of a series of silicon wafers 12a.

Figure 3:
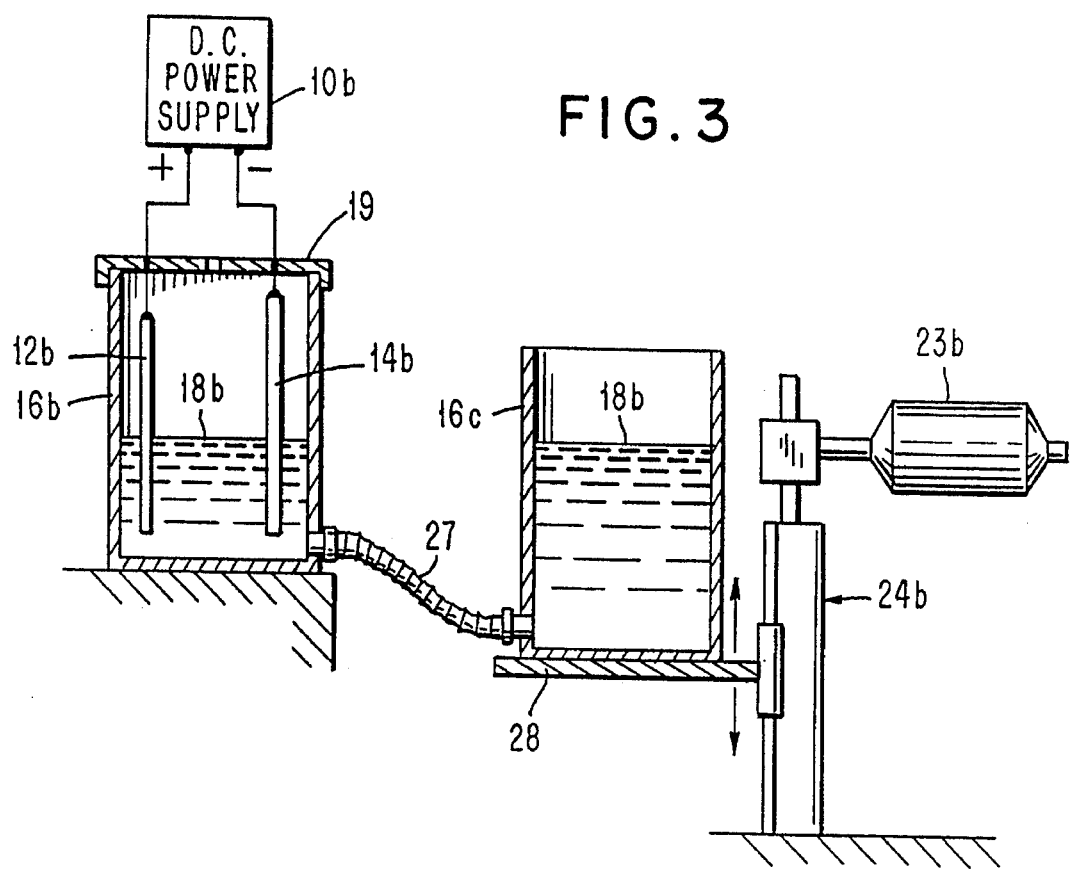
FIG. 3 is a schematic diagram illustrating another apparatus for immersion scanning wherein an overflow vessel is mechanically displaced vertically in elevator fashion to control the hydrostatic flow of electrolyte in and out of the electrochemical cell.

Another example of an alternative immersion scanning system arrangement is shown in FIG. 3 wherein the displacement of the electrolyte is controlled hydrostatically by an overflow elevator vessel. As seen in the Figure, the electrode chamber may be a separate vessel 16b in communication with a second electrolyte-containing vessel 16c through a flexible tube 27. Vessel 16c is mounted on an elevator 28 which is operated by means of a suitable motor 23b and drive 24b. Elevating the vessel 16c will cause the level of the electrolyte 18b in vessel 16b to rise accordingly displacing the electrolyte relative to stationary electrodes, 12b and 14b. The open-ended unsealed configuration vents the electrode chamber permitting the raising and lowering of the electrolyte level therein. A suitable vented cover 19 may be used to hold the electrodes in proper alignment in the chamber.

Figure 4:
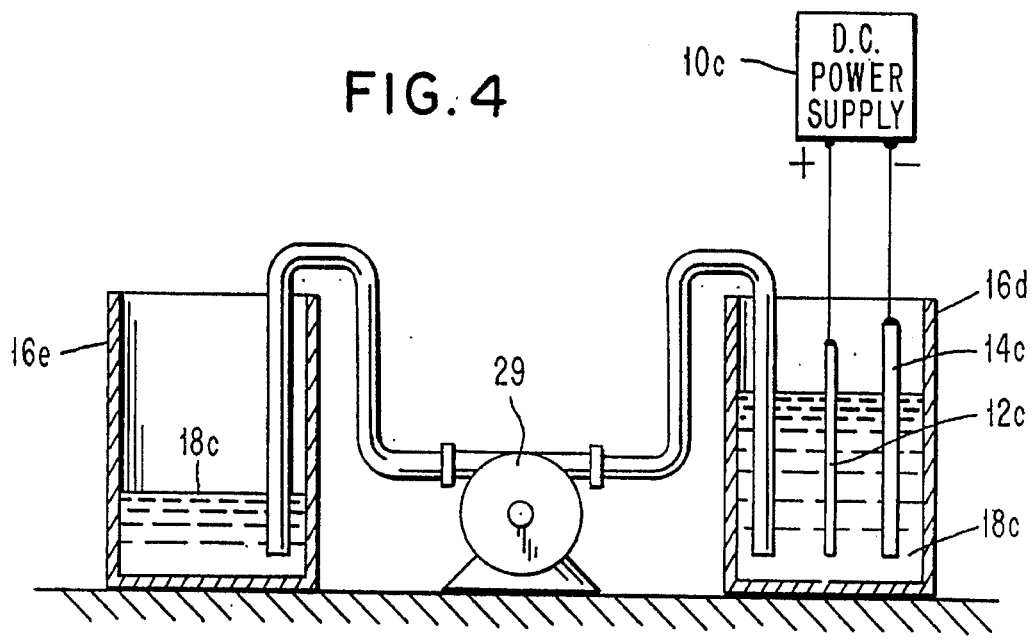
FIG. 4 is a schematic diagram illustrating a further apparatus for immersion scanning wherein a reversible circulating pump and overflow vessel control the flow of electrolyte across the Si surface to be anodized.

A further example of an alternative immersion scanning system arrangement is shown in FIG. 4. In this embodiment, a reversible circulating pump 29 is disposed between the electrode chamber, which again may be a separate vessel 16d, and a second electrolyte-containing vessel 16e. The pump 29 is operated to raise or lower the level of the electrolyte 18c in vessel 16d, depending on the direction of pumping, in accordance with the porous silicon forming process.

It is important to note that the displacement direction is not critical in the immersion process and the electrodes may be displaced in the electrolyte using either a vertical or horizontal geometry. The scanning speed is controlled through any suitable actuating means that will produce mechanical movement of the device components at a uniform or programmable varying rate so that the displacement of the anode with respect to the electrolyte is carefully regulated to result in a layer of porous silicon of the desired thickness and porosity. The essential structural arrangement of the invention permits ready observation of and precise control of the movement of the workpiece with respect to the electrolyte, so that, for example, the time of exposure of a patterned surface to attack by the electrolyte can be minimized.

Electrolyte

Turning to the electrolyte, the electrochemical etching solutions that are predominantly used in the art for making highly porous silicon are aqueous hydrofluoric acid (HF) with or without ethanol. A preferred electrolyte which is particularly adaptable to enhance the operability of device applications in accordance with the invention is an aqueous solution of HF and ammonium fluoride ($NH_4F$) generally in the composition ranges:

| | |
|---|---|
| 1–5 parts by volume | 49% aqueous HF |
| 5 parts by volume | saturated, 40% $NH_4F$ in $H_2O$ |
| 5 parts by volume | water |
| 1–10 ppm by weight | HF-compatible wetting agent |

A convenient way to prepare the electrolyte is to add standard 49% HF to commercially-available buffered HF solutions which contain HF, $NH_4F$, and a wetting agent. Suitable semiconductor-grade buffered HF solutions are readily obtainable from a number of chemical reagent vendors, such as, for example, the Transene Co. of Rowley, Mass. 01969. A preferred 5:5:3 mixture containing, by volume, 5 parts 9:1 buffered HF, 5 parts $H_2O$, and 3 parts 49% HF has been found to give consistently excellent results on low resistivity P-type Si wafers.

The wetting characteristics of the solution which affect gas bubble formation can be improved by adding acetic acid to the electrolyte in the concentration range of about 5–25%. In this regard, it should be understood that while typical electrochemical etching solutions used in making porous silicon involve aqueous HF, the exact chemical composition of the HF solution is quite arbitrary since the etching conditions, i.e., etching time and temperature, can be modified to produce a particular level of porosity through many different recipes.

Anodization Procedure

Using an apparatus and electrolyte as described, porous silicon is formed by the anodization of silicon with an applied DC current. In accordance with the invention a current in the range of about 10–100 $mA/cm^2$, based upon the area of the Si substrate, is applied across the anode and cathode, preferably during the immersion phase of the cycle only. The first phase of the cycle involves the preparation of the surface of the Si substrate for the formation of the porous silicon thereon. Surface preparation techniques commonly used in silicon IC technology have been found to be suitable for this purpose. When the Si substrate has been prepared, it is disposed, as the surface of the anode, opposite the surface of the cathode, and the two electrodes are immersed in the electrolyte. The DC current is produced between the electrodes by the application of a suitable voltage to activate the anodization process causing the formation of the porous Si layer on the surface of the substrate. The substrate is removed from the electrolyte at the appropriate time when the formation meets the porosity, uniformity and thickness parameters desired. The factors which are regulated to affect the porosity, uniformity and thickness of the porous silicon layer so formed are: the constant or programmed current density, the scanning speed, the composition of the electrolyte, and the Si substrate resistivity, conductivity type, and crystal orientation.

For the fabrication of photoresist patterned devices, it is essential that photoresist exposure to the HF-based electrolyte be minimized to prevent flaking and degradation, i.e., lifting off, of the photoresist film. To improve its integrity, the photoresist pattern should be UV-hardened by baking at about 150°–250° C. while exposed to ultra-violet (UV) light for periods of time ranging from about 1 min–60 mins. A novolak-based photoresist that is UV-hardened for about 5–10 mins at 200° C. readily withstands anodization at 50–100 $mA/cm^2$ for 10–60 seconds in the 0.5:5:3 electrolyte. To prevent the photoresist pattern from lifting off during the anodization process, surface treatments which enhance the adhesion of photoresist to the substrate may also be used, such as adhesion promoters and exposure to plasma.

Examples

The immersion scanning technique of the present invention has been applied to blank and lithographically patterned Si wafers to fabricate porous silicon layers thereon. Visible to near-infrared-photoluminescence (PL) spectra of porous silicon layers made by this technique have been found to be similar to conventionally produced porous silicon. Si diodes with porous silicon PN junctions have been fabricated with standard Si VLSI processes and shown to emit visible light under forward bias only. Visible light emission under forward bias was detected which increases linearly in intensity with input current.

More particularly, most of the fabrications were performed using (100)-oriented, 125 mm diameter, 0.1–10 $\Omega$-cm, P-type Si wafers with microporous silicon layers 0.3–5 μm thick, of 80% porosity, and a density of 0.3–0.4 $g/cm^3$. Post-anodization leaching in HF was generally not employed.

Figure 5:
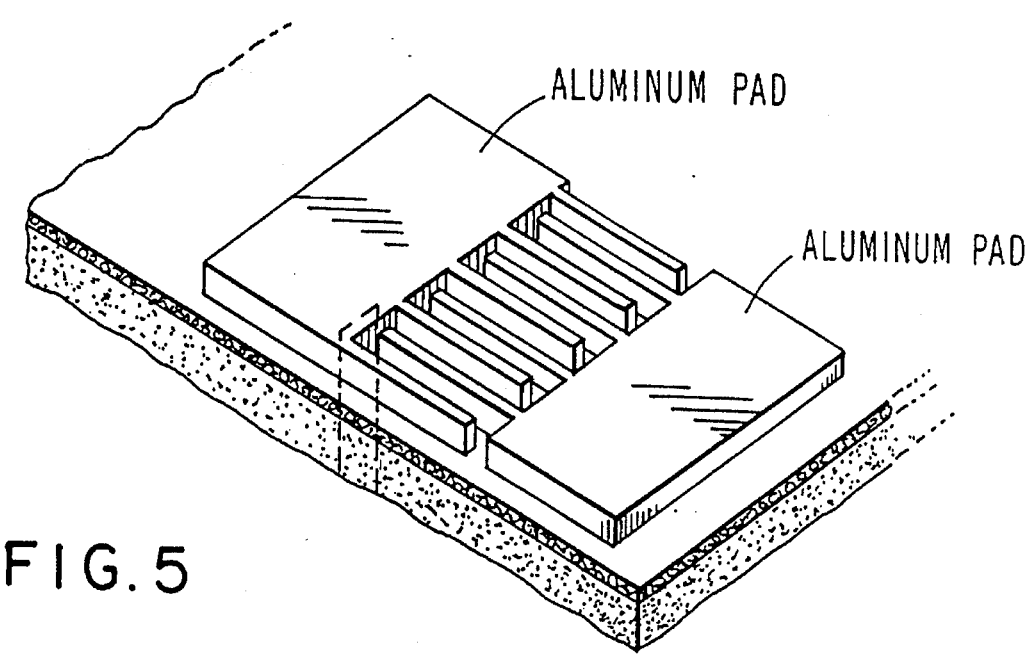
FIG. 5 is a view in perspective of a structure of a porous silicon PN junction in an interdigitated device produced by the present invention.
Figure 6:
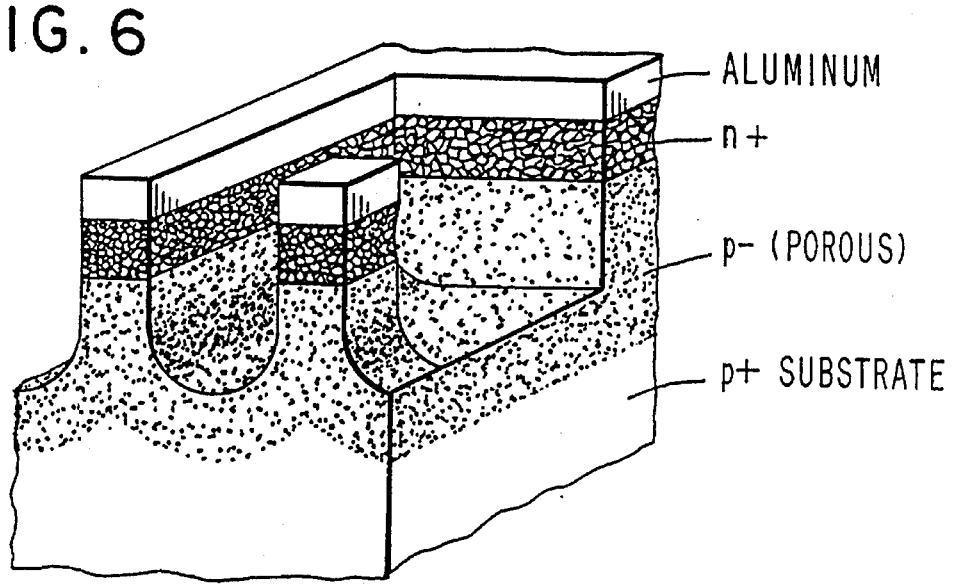
FIG. 6 is a view in perspective of a cross section through a digit in the structure of FIG. 5.

The structure of an interdigitated device with a porous silicon PN junction so fabricated is shown in FIG. 5 and a cross section through a digit of the fabricated PN junction is shown in FIG. 6. The fabrication process employed conventional Si VLSI methods on standard $P^-Si$ (1–3 μm thick) on a (100)-oriented $P^+Si$ substrate. After arsenic ion implantation to produce an $N^+$ surface layer approximately 0.5 μm thick, an Al film was deposited, patterned and etched, and the unmasked $N^+$ layer removed by RIE to pattern interdigitated structures with 1 μm wide Al fingers and 1–7 μm finger spacing. Following UV-hardening, the PN junctions were laterally anodized in 5:5:3 electrolyte at 50 $mA/cm^2$ for 10 seconds to produce a porous layer 1 μm thick preferentially on the exposed $P^-Si$ surface including the mesa sidewalls (FIG. 6).

Figure 7:
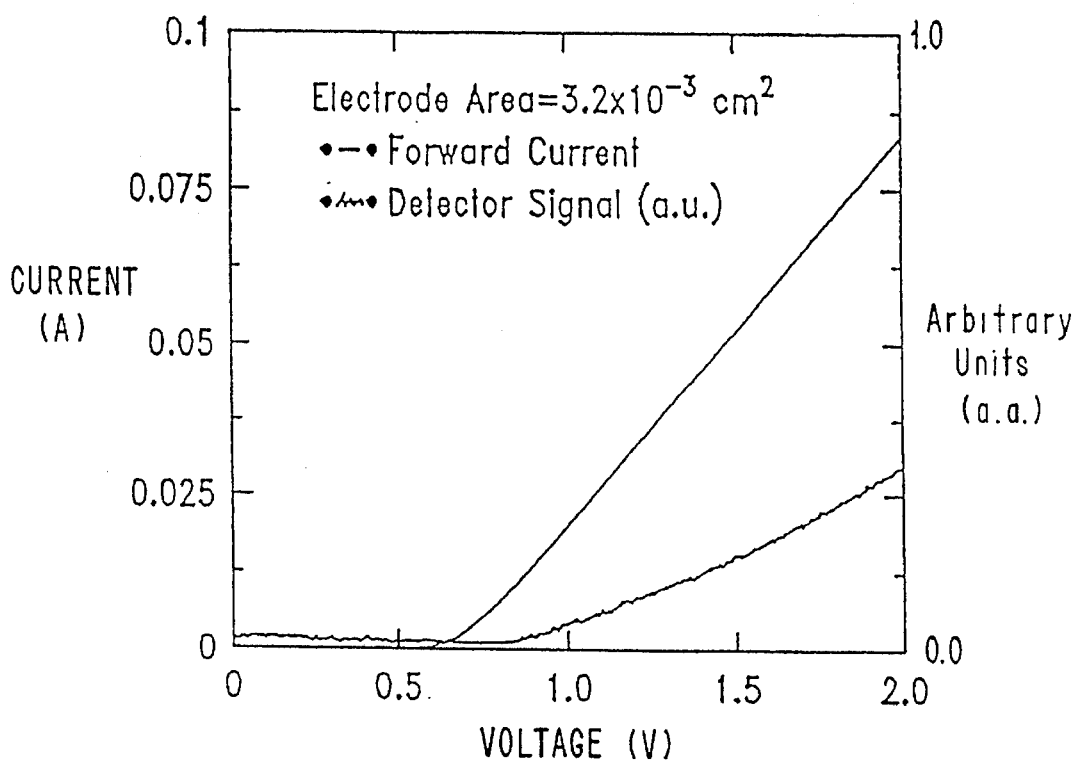
FIG. 7 is a plot of the Current-Voltage characteristics of a porous silicon PN junction showing the linear behavior of forward current and emitted visible light output as measured by a photodetector.
Figure 8:
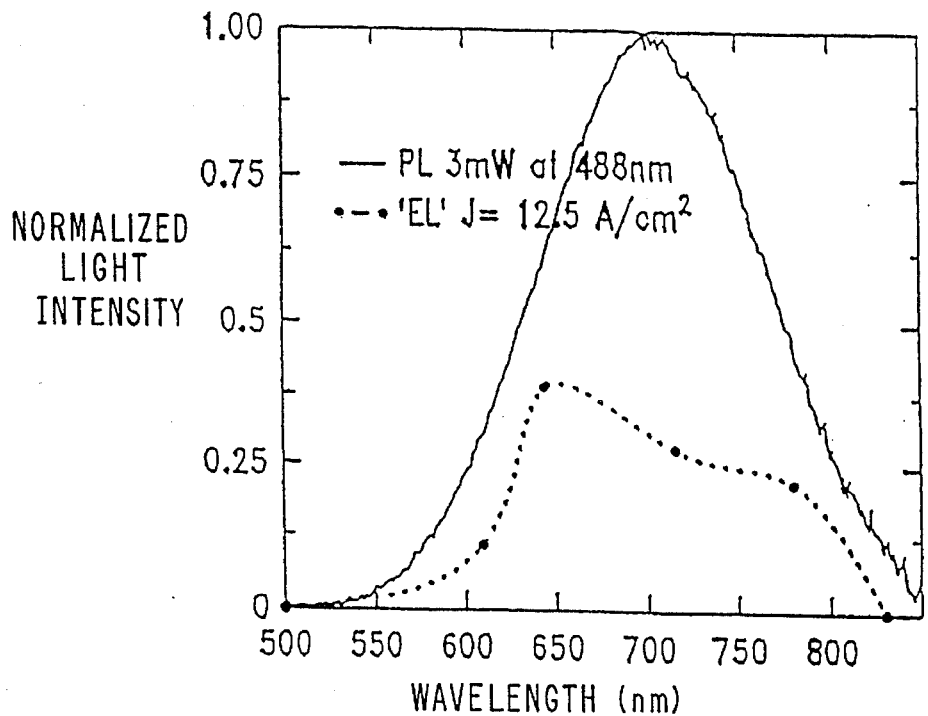
FIG. 8 illustrates the electroluminescence (EL) of a microporous silicon PN junction at a current density of 12.5 $A/cm^2$ and the photoluminescence (PL) spectrum of the same porous silicon layer obtained with an $Ar^+$ laser excitation source at 488 nm.

FIG. 7 shows the forward current-voltage characteristics of a porous Si PN juntion (finger to substrate) fabricated by the described technique and the corresponding intensity of light emission in the visible region of the spectrum as measured at room temperature inside a dark probe station with an HP 4145 parameter analyzer. Light emission from the diodes under forward bias was measured with a Si photodetector placed directly above the devices. It will be seen that the input current and light intensity are linear and no light emission is detected at voltages less than the junction turn-on voltage (0.7 V), indicating that the electroluminescence is a result of carrier injection. The photodetector signal starts to rise at the turn-on voltage (0.7 V) and increases linearly with the input current. Light emission is thus likely to be due to minority carrier injection and not the result of joule heating. To spectrally resolve the light output, a set of sharp cut-off long-pass filters was used to estimate the integrated differential intensity at discrete wavelengths. The normalized experimental data points were used to construct the electroluminescence (EL) spectrum of the PN junctions, at a current density of 12.5 $A/cm^2$, as shown in FIG. 8. Also shown for comparison is the PL spectrum from the same microporous silicon layer obtained with an $Ar^+$ laser excitation source at 488 nm. It will be seen that this porous silicon layer luminesces from visible to near-infrared wavelengths, i.e., 550 to 800+nm. However, in general, changing of the pore size may be used to produce porous silicon that will luminesce at wavelengths within the range between about 450 to 1100 nm.

It is important to note that while one particular device structure, i.e., interdigitated p-n junctions, has been described above, several other device structures that emit light by incorporating porous silicon layers therein are contemplated and will be within the purview of those skilled in the art in view of this description. For example, while the described device emits light vertically, such other device structures may involve the emission of light horizontally through a waveguide structure.

Temperature and Ambient Effects

Figure 9:
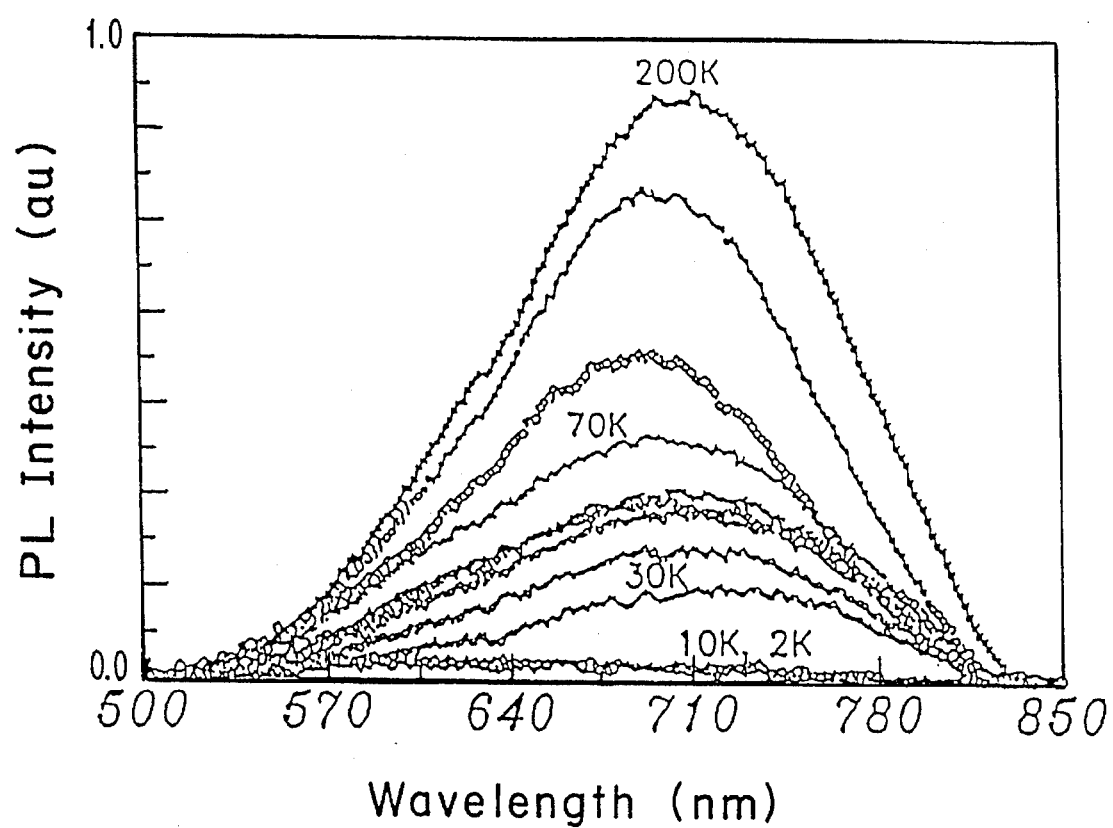
FIG. 9 illustrates the temperature dependent photoluminescence spectra of microporous (i.e., pore size $\leq 20Å$) silicon at temperatures between 2K and 200 K.

Low temperature PL measurements using $Ar^+$ ion laser excitation (1 mW) chopped at 3 kHz were performed in a He ambient cryostat on device samples fabricated in accordance with the invention. The spectrally resolved PL signal intensity was recorded as the temperature was lowered from 200° to 2° K, and then ramped back to 200° K. The decrease in PL intensity with temperature is shown in FIG. 9. The broad luminescence peak was blue shifted slightly; however, the broad nature of the PL spectrum makes quantitative estimates of the shift in peak position difficult. The PL returned to the original intensity when the temperature was ramped back to 200° K, suggesting that no permanent damage resulted to the porous silicon during cooling. In the temperature range between 300° K and 200° K, the PL signal may increase in intensity. Further, the results suggest that the PL may be related to the thermalization of defects which have a broad energy distribution in the band-gap of porous silicon.

Thermal desorption experiments were performed by heating the samples in ultra-high vacuum (UHV) at a rate of 1° C./sec., while monitoring the hydrogen (H) desorption with a mass spectrometer. The PL broad-band intensity was visually observed under a broad UV source. The classic H desorption spectrum was obtained with a concomitant loss of PL intensity as the temperature was increased to 550° C. The PL signal could be recovered by returning the samples to room temperature and rehydrogenating the surfaces by immersion in HF solution. The PL intensity loss was irreversible for samples heated above 550° C.

Figure 10:
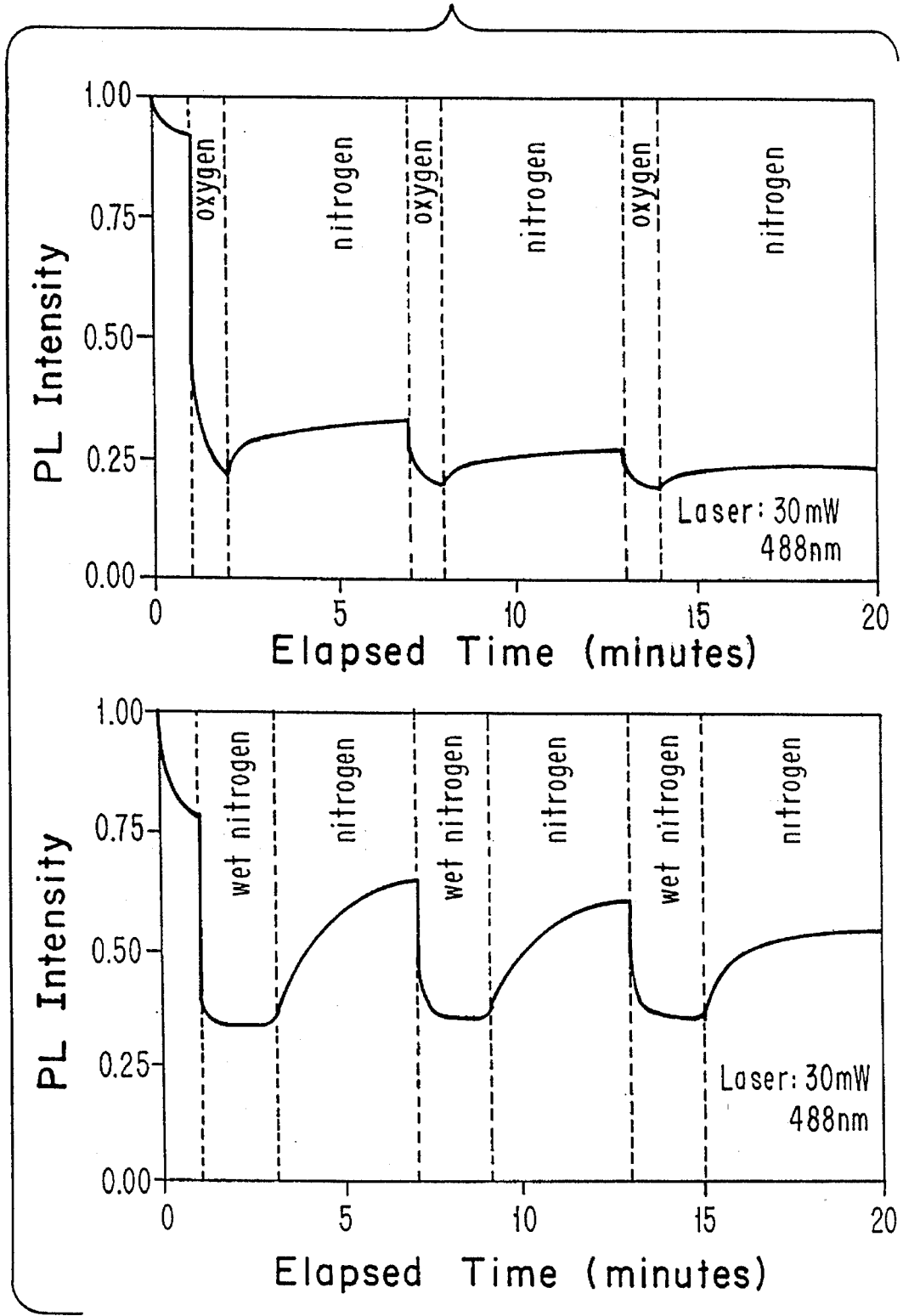
FIG. 10 illustrates the degradation of the photoluminescent intensity of microporous silicon in $O_2$ (top), and wet $N_2$ (bottom), with simultaneous excitation at 488 nm.

Microporous silicon samples subjected to ambient cycling experiments were leached in 17% aq. HF immediately following anodization. Time scans under ($Ar^+$ ion) laser excitation (30 mW) were conducted in a flowing gas cell. Optical alignment prior to the scans was performed at 0.5 mW power in a dry $N_2$ ambient. As shown in FIG. 10, PL intensity degraded slightly in $N_2$ gas, but stabilized within two minutes. Switching to $O_2$ gas, caused the intensity to decay exponentially with a time constant of 43 sec. (75% decay in 60 sec.). Returning to a $N_2$ ambient resulted in a partial recovery of PL intensity. The surface was thus irreversibly changed by exposure to $O_2$ gas while under laser illumination. Similar observations have been reported in the above-cited *Materials Research Society* Symposium Proceedings, by M. A. TISCHLER ET AL, "Luminescence Degradation in Porous Si", and also earlier observations were reported by L. T. CANHAM in "Room temperature photoluminescence from etched silicon surfaces: the effects of chemical pretreatments and gaseous ambients", *J. Phys. Chem. Solids*, Vol. 47, pps. 363–373 (1986). Exposure to $N_2$ gas saturated with water vapor (wet $N_2$), resulted in rapid PL degradation which levelled off within two minutes, but was partially recovered after switching to dry $N_2$ gas. Cycling between wet and dry $N_2$ resulted in a continuous drop to the PL intensity level in wet $N_2$.

To further evaluate the qualities of the porous silicon so formed, deposition of various materials on as-anodized microporous silicon samples was done in UHV. The photoluminescence (PL) was significantly quenched after the deposition of 45 nm of plasma-enhanced chemical vapor deposition (PECVD) $SiO_2$ at 350° C. Amorphous Si films of increasing thickness were deposited at 250° C. The PL intensity was not significantly diminished by the deposition of films up to 300 nm thick. After amorphous Si deposition these samples were heated in situ to 500° C., without a significant loss of PL intensity. The deposition of an amorphous germanium (Ge) film (100 nm thick) at 250° C. resulted in a significant quenching of the PL. The effect was reversible by removal of the Ge film and subsequent rehydrogenation by dipping the Si substrate in HF. In these experiments, the broad-band PL intensity was observed under broad UV excitation.

It will be seen from the foregoing description that among the advantages of the immersion scanning method of the present invention are:

1. the apparatus is simple, low cost, and adaptable to single and batch wafer processing;
2. the set-up procedure and the anodization process are rapid, so that unnecessary exposure of the substrate to the electrolyte is minimized or completely eliminated (i.e., porous silicon can be fabricated in a Si substrate in a matter of seconds);
3. substrates of any size and geometry are easily accommodated;
4. a blank or patterned surface of a Si substrate can be partially or totally anodized;
5. the thickness and porosity of a Si substrate surface can be varied selectively by controlling the local current density distribution; and
6. in-situ monitoring during anodization can be readily performed, which feature is particularly useful in device fabrication.

The invention will be found useful in applications related to optoelectronic devices, components, and systems, including subassemblies such as photonic transmitters and receivers.

What is claimed is:

1. A method for producing porous silicon on the surface of a substrate to fabricate a light-emitting Si device, comprising the steps of:

providing an anode having a surface formed on a substrate composed at least substantially of silicon, for receiving porous silicon to be produced by anodization on said surface;

providing an electrochemical cell containing an electrolyte and having an unsealed opening therein for receiving said anode into said electrolyte for said anodization;

providing a cathode having a surface disposed opposite said surface of said anode in said electrolyte, for cooperating with said anode in said anodization;

moving said anode and said electrolyte with respect to each other to immerse said anode in said electrolyte for said anodization and remove said anode from said electrolyte after anodization; and producing a current between said anode and said cathode when they are immersed in said electrolyte to perform said anodization, wherein said electrolyte comprises an aqueous solution of 10–25% hydrofluoric acid (HF) and 5–25% acetic acid.

2. A method as in claim 1 wherein the speed of moving said anode with respect to said electrolyte is regulated to control at least one of the qualities of uniformity, thickness, and porosity, of the porous silicon received on said anode surface.

3. A method as in claim 1 wherein the density of said current is regulated to control at least one of the qualities of uniformity, thickness, and porosity, of the porous silicon received on said anode surface.

4. A method as in claim 1 wherein said substrate has a patterned surface and wherein the speed of moving said anode with respect to said electrolyte is regulated to expose said surface to least attack by said electrolyte.

5. A method as in claim 1 wherein the resistivity of said substrate is selected to produce a desired uniformity, thickness and porosity of the porous silicon received on said anode surface.

6. A method as in claim 1 wherein the conductivity type of said substrate is selected to produce a desired uniformity, thickness and porosity of the porous silicon received on said anode surface.

7. A method as in claim 1 wherein the crystal orientation of said substrate is selected to produce a desired uniformity, thickness and porosity of the porous silicon received on said anode surface.

8. A method as in claim 1 wherein said step of moving said anode with respect to said electrolyte comprises inserting said anode into said electrolyte and removing it therefrom.

9. A method as in claim 1 wherein said step of moving said anode with respect to said electrolyte comprises raising and lowering the level of said electrolyte in said cell to immerse said anode therein.

10. A method as in claim 1 wherein said anode comprises a plurality of said substrates and said opening in said cell is dimensioned to accomodate the simultaneous passage of said substrates therethrough.

11. A method for producing porous silicon on the surface of a substrate to fabricate a light-emitting Si device, comprising the steps of:

providing an anode having a surface formed on a substrate composed at least substantially of silicon, for receiving porous silicon to be produced by anodization on said surface;

providing an electrochemical cell containing an electrolyte and having an unsealed opening therein for receiving said anode into said electrolyte for said anodization;

providing a cathode having a surface disposed opposite said surface of said anode in said electrolyte, for cooperating with said anode in said anodization;

moving said anode and said electrolyte with respect to each other to immerse said anode in said electrolyte for said anodization and remove said anode from said electrolyte after anodization; and producing a current between said anode and said cathode when they are immersed in said electrolyte to perform said anodization, wherein said electrolyte comprises an aqueous solution of hydrofluoric acid (HF) and ammonium fluoride ($NH_4F$) in the composition ranges:

1–5 parts by volume . . . 49% aqueous HF
5 parts by volume . . . saturated, 40% $NH_4F$ in $H_2O$
5 parts by volume . . . water
1–10 ppm by weight . . . HF-compatible wetting agent.

12. A method as in claim 11 wherein said electrolyte is prepared by adding standard 49% HF to buffered HF solutions which contain HF, $NH_4F$, and a wetting agent, to obtain a 5:5:3 mixture containing, by volume, 5 parts 9:1 buffered HF, 5 parts $H_2O$, and 3 parts 49% HF.

13. A method as in claim 11 wherein said electrolyte includes acetic acid in the concentration range of about 5–25%.

14. A method as in claim 11 wherein the concentration of said electrolyte is regulated to control at least one of the qualities of uniformity, thickness, and porosity, of the porous silicon received on said anode surface.

* * * * *